US010637517B2

(12) United States Patent
Tham et al.

(10) Patent No.: US 10,637,517 B2
(45) Date of Patent: *Apr. 28, 2020

(54) METHOD AND APPARATUS TO DETECT LO LEAKAGE AND IMAGE REJECTION USING A SINGLE TRANSISTOR

(71) Applicant: Tensorcom, Inc., Culver City, CA (US)

(72) Inventors: KhongMeng Tham, San Diego, CA (US); Huainan Ma, Laguna Hills, CA (US); Zaw Soe, Encinitas, CA (US); Ricky Lap Kei Cheung, San Diego, CA (US)

(73) Assignee: TensorCom, Inc., Culver City, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/122,669

(22) Filed: Sep. 5, 2018

(65) Prior Publication Data

US 2019/0007076 A1    Jan. 3, 2019

Related U.S. Application Data

(63) Continuation of application No. 15/505,444, filed as application No. PCT/US2015/046740 on Aug. 25, (Continued)

(51) Int. Cl.
*H04B 1/04* (2006.01)
*H03D 3/00* (2006.01)
(Continued)

(52) U.S. Cl.
CPC ........... *H04B 1/0475* (2013.01); *H03D 3/008* (2013.01); *H03D 3/009* (2013.01); *H03D 7/125* (2013.01);
(Continued)

(58) Field of Classification Search
CPC ........ H03D 7/165; H03D 3/008; H03D 3/009; H04B 1/0475; H04B 1/04; H04B 1/0458; H04B 1/44
(Continued)

(56) References Cited

U.S. PATENT DOCUMENTS 7,692,491 B2    4/2010    Makihara
7,787,564 B1    8/2010    Anvari
(Continued)

FOREIGN PATENT DOCUMENTS

JP    2011103541    5/2011
JP    2012527800    11/2012
(Continued)

OTHER PUBLICATIONS

Craninckx, et al.; "A WLAN Direct Up-Conversion Mixer with Automatic Image Rejection Calibration," ISSCC. 2005 IEEE International Digest of Technical Papers. Solid-State Circuits Conference, 2005. vol. 1, pp. 546-616, Feb. 2005. cited byapplicant.
(Continued)

*Primary Examiner* — Emmanuel Bayard
(74) *Attorney, Agent, or Firm* — Mintz Levin Cohn Ferris Glovsky and Popeo, P.C.

(57) ABSTRACT

Local oscillator (LO) leakage and Image are common and undesirable effects in typical transmitters. Typically, fairly complex hardware and algorithms are used to calibrate and reduce these impairments. A single transistor that draws essentially no dc current and occupies a very small area detects the LO leakage and Image signals. The single transistor operating as a square-law device is used to mix the signals at the input and output ports of a power amplifier. The mixed signal generated by the single transistor enables the simultaneous calibration of the LO leakage and Image Rejection.

29 Claims, 12 Drawing Sheets

Related U.S. Application Data 2015, now Pat. No. 10,103,757, which is a continuation of application No. 14/467,075, filed on Aug. 25, 2014, now Pat. No. 9,450,537.

(51) Int. Cl.
*H03D 7/16* (2006.01)
*H03D 7/12* (2006.01)

(52) U.S. Cl.
CPC ............ *H03D 7/165* (2013.01); *H04B 1/04* (2013.01); *H04B 1/0458* (2013.01); *H03C 2200/0058* (2013.01); *H04B 2001/0408* (2013.01)

(58) Field of Classification Search
USPC .................................................. 375/295–297
See application file for complete search history.

(56) References Cited

U.S. PATENT DOCUMENTS

| | | | |
|---|---|---|---|
| 7,986,186 B2 | 7/2011 | Marbell | |
| 8,744,379 B1 | 6/2014 | Sung | |
| 8,803,720 B2* | 8/2014 | Dufrene | H03M 1/0612 341/144 |
| 8,957,728 B2* | 2/2015 | Gorisse | H03F 1/34 330/136 |
| 9,450,537 B2 | 9/2016 | Tham | |
| 9,991,751 B2* | 6/2018 | Taghivand | H02J 50/20 |
| 10,103,757 B2* | 10/2018 | Tham | H03D 3/008 |
| 2005/0179498 A1 | 8/2005 | Tsutsui | |
| 2005/0259724 A1 | 11/2005 | Bergstrom | |
| 2006/0009171 A1 | 1/2006 | Xu et al. | |
| 2006/0009180 A1 | 1/2006 | Xu et al. | |
| 2006/0057980 A1 | 3/2006 | Haque | |
| 2006/0128340 A1 | 6/2006 | Hsieh et al. | |
| 2008/0218271 A1 | 9/2008 | Mitzlaff | |
| 2010/0156536 A1 | 6/2010 | Lee | |
| 2011/0043276 A1 | 2/2011 | Ito | |
| 2011/0260797 A1 | 10/2011 | Lee | |
| 2011/0298539 A1 | 12/2011 | Drogi | |
| 2012/0033758 A1 | 2/2012 | Cloutier et al. | |
| 2013/0266045 A1 | 10/2013 | Lakkis | |
| 2014/0118066 A1 | 5/2014 | Lee | |
| 2014/0184341 A1 | 7/2014 | Parker | |
| 2014/0292406 A1 | 10/2014 | Dechen | |
| 2016/0065199 A1 | 3/2016 | Hagiwara | |

FOREIGN PATENT DOCUMENTS

| | | |
|---|---|---|
| WO | WO-2010133253 | 11/2010 |
| WO | WO-2013090561 | 6/2013 |
| WO | WO-2013126898 | 8/2013 |

OTHER PUBLICATIONS

Kawai, et al.; "A Digitally-Calibrated 20-Gb/s 60-GHz Direct-Conversion Transceiver in 65-nm CMOS," 2013 IEEE Radio Frequency Integrated Circuits Symposium (RFIC), pp. 137-140, Jun. 2-4, 2013.

Lopelli, et al., "A 40nm Wideband Direct-Conversion Transmitter with Sub-Sampling-Based Output Power, LO Feedthrough and I/Q Imbalance Calibration," Solid-State Circuits Conference Digest of Technical Papers (ISSCC), 2011 IEEE International, Feb. 20-24, 2011, pp. 424-426.

M.A.I. Elmala, S.H.K. Embabi, "Calibration of Phase and Gain Mismatches in Weaver Image-Reject Receiver," Solid-State Circuits, IEEE Journal of (vol. 39, Issue: 2), Feb. 2004, pp. 283-289.

Montemayor, B. Razavi, "A Self-Calibrating 900-MHz CMOS Image-Reject Receiver," Solid-State Circuits Conference, 2000. ESSCIRC '00. Proceedings of the26rd European,Sep. 19-21, 2000, pp. 320-323.

Myllari ,Olli, L. Anttila, M. Valkama, "Digital Transmitter I/Q Imbalance Calibration: Real-Time Prototype Implementation and Performance Measurement," 18th European Signal Processing Conference (EUSIPCO—2010), Aalborg, Denmark, Aug. 23-27, 2010, pp. 537-541.

Wang, Chao-Shiun, "Sampled-and-Hold Based Automatic Calibration Modulator for WLAN Transmitter," 2005 IEEE Asian Solid-State Circuits Conference, Year: 2005 pp. 77-80, Nov. 1-3, 2005.

Yin, et al.; "A 0.1-5GHz Sdr Transmitter with Dual-Mode Power Amplifier and Digital-Assisted I/Q Imbalance Calibration in 65nm CMOS," Solid-State Circuits Conference (A-SSCC), 2013 IEEE Asian, pp. 205-208, Nov. 11-13, 2013.

\* cited by examiner

METHOD AND APPARATUS TO DETECT LO LEAKAGE AND IMAGE REJECTION USING A SINGLE TRANSISTOR

CROSS-REFERENCE TO OTHER APPLICATIONS

This application is a continuation application of U.S. patent application Ser. No. 15/505,444 filed Feb. 21, 2017, entitled "METHOD AND APPARATUS TO DETECT LO LEAKAGE AND IMAGE REJECTION USING A SINGLE TRANSISTOR," which is a U.S. National Stage under 35 U.S.C. 371 of PCT Application No. PCT/US15/46740 filed on Aug. 25, 2015, entitled "METHOD AND APPARATUS TO DETECT LO LEAKAGE AND IMAGE REJECTION USING A SINGLE TRANSISTOR," which is a continuation of U.S. patent application Ser. No. 14/467,075 filed Aug. 25, 2014, now U.S. Pat. No. 9,450,537, entitled "METHOD AND APPARATUS TO DETECT LO LEAKAGE AND IMAGE REJECTION USING A SINGLE TRANSISTOR." The contents of these applications are incorporated hereinby reference in their entirety.

BACKGROUND OF THE INVENTION

The Federal Communications Commission (FCC) has allocated spectrum in the 60 GHz band for commercial wireless applications. The Wireless Gigabit Alliance (Wi-Gig) was developed to promote the IEEE 802.11ad protocol, which operates in this frequency band and is expected to deliver data transfer rates up to 7 Gbps.

Integrated circuits formed in semiconductor dies offer high-frequency operation in millimeter-wave bands. Some of these integrated circuits utilize Complementary Metal Oxide Semiconductor (CMOS), Silicon-Germanium (SiGe), or GaAs (Gallium Arsenide) technology to form the dies.

In millimeter-wave systems, the transmit paths of signals transmitted in the wireless channel need to be compensated for various mismatch conditions occurring in the up-convertor circuit. Some of these conditions manifest as local oscillator (LO) leakage and signal image in the transmitted RF spectrum.

CMOS is the primary technology used to construct integrated circuits. N-channel transistors and P-channel transistors (MOS transistor) use fine-line technology to consistently reduce the channel length of the MOS transistors. Current channel lengths are 40 nm, the power supply of VDD is 1.2V, and the number of layers of metal levels can be 8 or more.

CMOS offers the computing power to perform many of the required compensation techniques to overcome the adverse conditions in the transceiver. Yet, the computing power must be used in a power-efficient manner to ensure that dissipated power is low enough to allow these important transceiver building blocks fabricated in CMOS to be used in mobile applications. This helps conserve the transceiver's battery power while achieving the optimum performance.

BRIEF SUMMARY OF THE INVENTION

Various embodiments and aspects of the invention are described with reference to details discussed below, and the accompanying drawings illustrate the various aspects and embodiments. The following description and drawings are illustrative of aspects of the disclosure and are not to be construed as limiting. Numerous specific details are disclosed to provide a thorough understanding of various aspects and embodiments. However, in certain instances, well-known or conventional details are omitted in order to provide a concise discussion of such aspects and embodiments.

One aspect relates to the use of a single transistor to mix two RF spectra in a series signal path and down-convert the signal to extract signal components that indicate the level of LO leakage and image rejection within the spectra of the desired RF signal. Previous techniques to perform the same function required complex circuit components, such as a mixer, a feedback VCO, and a filter, in order to detect the distortions. These three major processing blocks require dozens of transistors, inductors, and capacitors, and can occupy a significant portion of area on the integrated circuit substrate (chip). The VCO alone requires a charge pump, a loop filter, a pre-scalar, a divider, a crystal oscillator, and/or a sigma delta modulator. Furthermore, these circuit components need to be designed for stability concerns where the PLL transient behavior, settling time, VCO capacitor bank calibration, etc. within the feedback VCO needs to be designed and simulated to operate within tight tolerances. In accordance with certain aspects of the invention, a single transistor replaces all of these components, simplifying the design and reducing the area and power dissipation by nearly two orders of magnitude.

Another aspect relates to the tapping of the RF spectra from different pairs of ports in a series signal path. A single transistor performs the mixing function and can be coupled to any two ports of the series signal path to determine the down-converted signal components. Furthermore, the two tapped ports can be flipped and applied to the single transistor where the transistor can still operate to detect the level of LO leakage and image rejection within the spectra of the desired RF signal.

Another aspect relates to an apparatus to mix a first signal with a second signal comprising: a plurality of circuit elements coupled in series forming a series signal path; one of the plurality of circuit elements having an input node and an output node coupled within the series signal path; a gate of a transistor connected to the input node; a source of the transistor connected to the output node; and a drain of the transistor coupled to a resultant node, wherein the transistor mixes the first signal at the input node with the second signal at the output node a generating a mixed signal between the first signal and the second signal at the resultant node, further comprising: a first spectra comprising a first homodyne signal, a first LO leakage signal, and a first image rejection signal applied to the input node; and a version of the first spectra comprising a second homodyne signal, a second LO leakage signal, and a second image rejection signal modified by the one of the circuit elements at the output node, further comprising: an input port coupled to an input of the series signal path; and an output port coupled to an output of the series signal path, wherein an up-converted RF signal is coupled to the input port, further comprising: a low pass filter (LPF) coupled to the resultant node; and a digital signal processor (DSP) coupled to the LPF, wherein the DSP calculates correction factors to reduce the LO leakage signals and the image rejection signals in all the spectra. The apparatus further comprising: an antecedent circuit element coupled to the one of the circuit elements at the input port; and a subsequent circuit element coupled to the one of the circuit elements at the output port, wherein an up-converted RF signal is coupled to the antecedent circuit element, wherein the one of the circuit elements is an amplifier stage that either non-inverts or inverts the second signal with regard to the first signal, wherein the one of the circuit elements is an amplifier stage that amplifies and phase shifts the second signal with regard to the first signal.

Another aspect relates to an apparatus configured to generate a self-mixed signal comprising: a first circuit element including an input node and an output node; a gate of a transistor coupled to the input node; a source of the transistor coupled to the output node; a drain of the transistor coupled to a resultant node; a first spectra comprising a first homodyne signal, a first LO leakage signal, and a first image rejection signal applied to the input node; and a version of the first spectra comprising a second homodyne signal, a second LO leakage signal, and a second image rejection signal modified by the circuit element and generated at the output node, wherein the transistor mixes the first spectra with the version of the first spectra generating the self-mixed signal at the resultant node, further comprising: an antecedent circuit element with an input port coupled to first circuit element at the input node; and a subsequent circuit element coupled with an output port coupled to the first circuit element at the output node, wherein an up-converted RF signal is coupled to the input port, further comprising: an antenna coupled to the output port. The apparatus further comprising: a low pass filter coupled to the resultant node, wherein the first circuit element is an amplifier stage that either non-inverts or inverts the input signal at the output node, wherein the first circuit element is an amplifier stage that amplifies and phase shifts the input signal at the output node.

Another aspect relates to a method to generate a mixed signal between two selected ports comprising the steps of: coupling a plurality of circuit elements in series forming a series signal path; assigning separate ports between two adjacent circuit elements within the series signal path, wherein an input port couples to an input of a first circuit element in the series signal path and an output port couples to an output of a last circuit element in the series signal path; selecting any two of the ports; connecting a gate of a transistor to a first selected port of the two of the ports; connecting a source of the transistor to a second selected port of the two of the ports; and coupling a drain of the transistor to a resultant node, wherein the transistor mixes a signal at the first selected port with a signal at the second selected port, thereby generating at the resultant node the mixed signal between the two selected ports, wherein the signal at the first selected port has a first spectra comprising at least one of a homodyne signal, a LO leakage signal, and an image rejection signal applied to the input node; and the signal at the second selected port has a second spectra comprising at least one of a version of the homodyne signal, a version of the LO leakage signal, and a version of the image rejection signal modified by at least one of the plurality of circuit elements, wherein the version components of the second spectra comprises at least a non-inverted or an inverted, an amplified or an attenuated, or a phase shifted component of the first spectra, further comprising the steps of: coupling a low pass filter to the resultant node, further comprising the steps of: coupling a digital signal processor (DSP) to an output of the low pass filter to calculate correction factors to reduce the LO leakage signals and the image rejection signals of all signals within the series signal path. The method further comprising the steps of: coupling an up-converted RF signal is to the input port, wherein the first selected port corresponds to an input node or an output node of an amplifier, and the second selected port corresponds to a remaining node of the amplifier.

BRIEF DESCRIPTION OF THE DRAWINGS

The drawings in this disclosure are not necessarily drawn to scale, and the relative dimensions of various elements in the diagrams are depicted schematically. Aspects of the invention presented here can comprise various different forms and should not be construed as limited to those disclosed herein. In some instances, well-known structures and functions have not been shown or described in detail for the sake of conciseness. Like numbers refer to like elements in the diagrams, unless noted otherwise.

DETAILED DESCRIPTION OF THE INVENTION

The WiGig standard provides for nearly a 10 GHz signal bandwidth capability in the 60 GHz band. Typically a direct conversion system is employed, which is known to suffer from I/Q mismatch that results in images being formed in the spectra of the transmitted signal. This is due to the gain and phase distortion mismatch between the "I" (in-phase) and the "Q" (quadrature-phase) signal paths. One solution is to perform a calibration procedure to eliminate distortions caused by the gain and phase distortions.

Another distortion occurs when the oscillator signal leaks into the signal path before frequency conversion. The oscillator signal when mixed with itself causes a DC offset to occur in the signal path. Additional DC offset occurs due to component mismatches within the mixer itself. This additional DC offset causes LO leakage when the mixer mixes the LO signal. This DC offset can saturate the following stages and needs to be reduced. A solution is to perform another calibration procedure to eliminate the distortions caused by this DC offset.

Figure 1A:
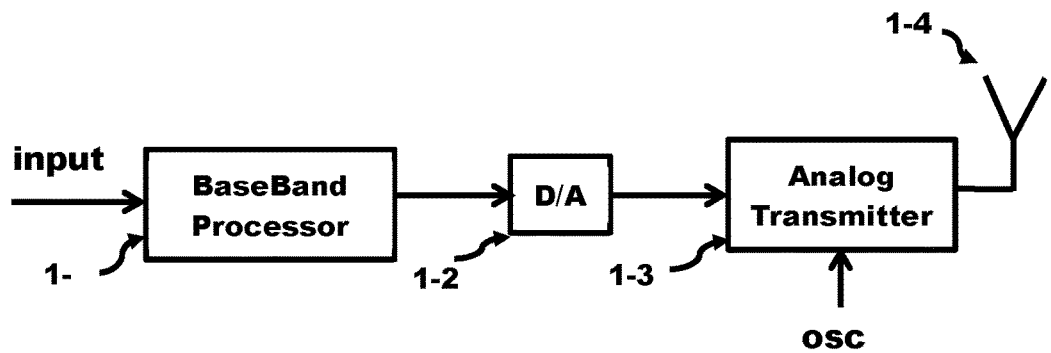
FIG. 1A depicts a baseband processor/transmitter/antenna path.

A baseband-transmitter block diagram is illustrated in FIG. 1. The signal enters the baseband processor 1-1 and is processed in preparation to be transmitted into free space via an antenna 1-4. The processing can be performed according to one of many given standards known in the industry. The processed signal is converted to analog with a digital to analog converter D/A 1-2. The analog signal from the D/A is applied to the analog transmitter which up-converts the baseband signal to a higher-carrier frequency. One example is a direct conversion transmitter where the spectrum of the baseband signal is translated by the local oscillator to the RF carrier frequency using a quadrature converter. The unconverted signal is transferred to the antenna 1-4 and coupled into free space.

Figure 1B:
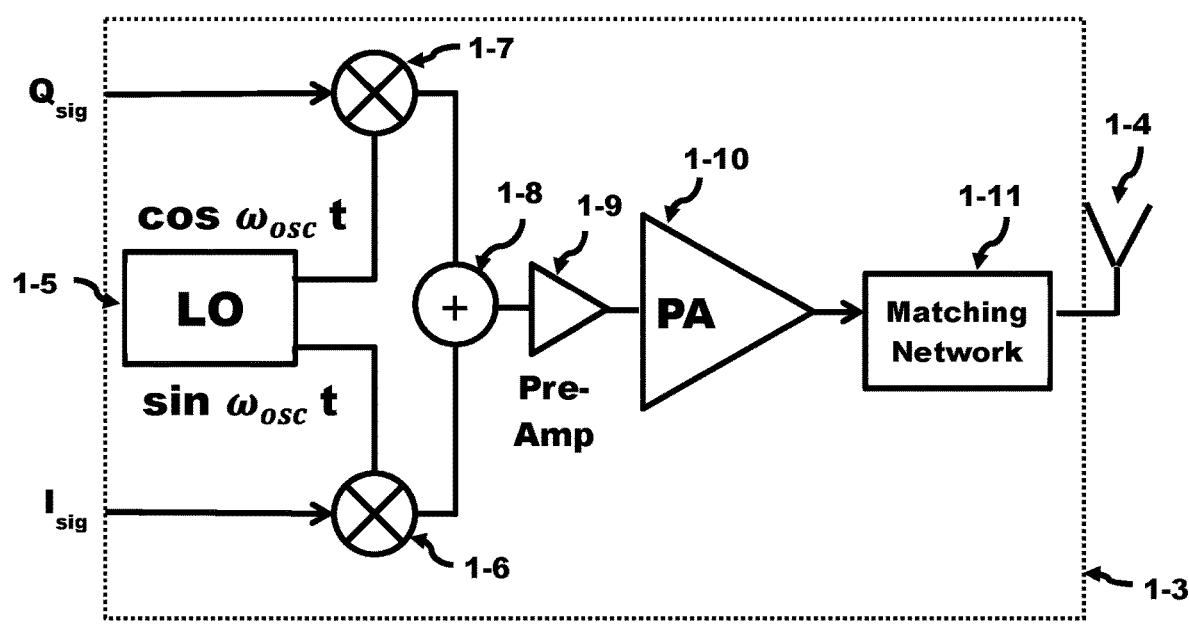
FIG. 1B illustrates a direct conversion transmitter driven by I/Q signals.

Further details of the analog transmitter 1-3 are illustrated in FIG. 1B. The inputs are quadrature baseband signals: $Q_{sig}$ and $I_{sig}$, where each $I_{sig}$ has a phase difference of 90° from that of $Q_{sig}$. These orthogonal signals, if combined, contain the original information. These two signals also comprise identical spectra. The $Q_{sig}$ is applied to first mixer 1-7, while the $I_{sig}$ is applied to second mixer 1-6. Both mixers are switched by the quadrature outputs of the LO 1-5. The cos $\omega_{osc}t$ waveform is used to mix $Q_{sig}$, while the sin $\omega_{osc}t$ waveform is used to mix $I_{sig}$. The outputs of the mixers 1-6 and 1-7 are added together by adder 1-8. The combined signal is applied to the pre-amplifier 1-9, which drives the power amplifier (PA) 1-10. The PA 1-10 further amplifies the signal. A matching network 1-11 ensures that the maximum power from the PA 1-10 is transferred to the antenna 1-4. The up-converted signal is provided with sufficient power for propagation into free space.

In a theoretically ideal circuit, such as may be conveyed with reference to the circuit diagram of FIG. 1B, a transmitter has ideal I/Q signals (phase and amplitude constant over the bandwidth) and an ideal oscillator which does not leak signal from the LO 1-5 into the baseband signal paths.

Figure 2A:
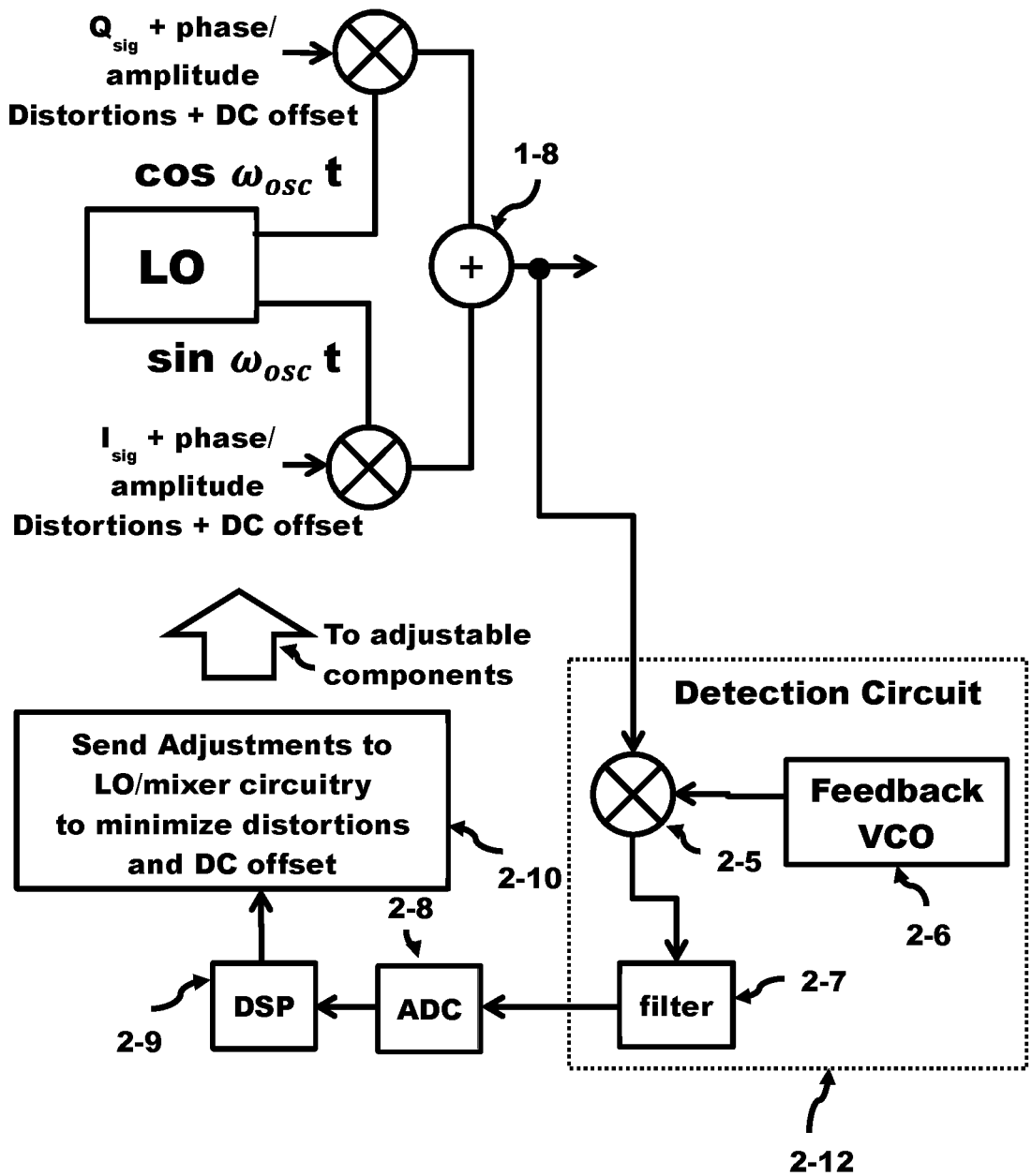
FIG. 2A is a block diagram of a direct conversion up-converter driven by I/Q signals along with phase/amplitude/DC offset distortions and corrective circuitry in accordance with an aspect of the invention.

FIG. 2A illustrates a transmitter with various forms of distortion introduced into the I/Q signals such as phase/amplitude distortion and an effective DC offset caused by LO carrier leakage and circuit mismatch. For example, the $Q_{sig}$ input applied to the input of the mixer 1-7 contains the desired signal $Q_{sig}$ plus the undesired phase/amplitude distortions and a DC offset. Similarly, the $I_{sig}$ input applied to the input of the mixer 1-6 contains the desired signal $I_{sig}$ plus the undesired phase/amplitude distortions and a DC offset These undesired distortions can degrade the ideal transmitted signal characteristics sought after in the ideal circuit of FIG. 1B.

The distortions in the amplitude and phase of the I/Q signals occur, in part, because of the frequency dependence of the transfer functions used to generate the I/Q signals, leakage of signals due to parasitic effects, and transistor and component mismatch. For example, the DC offset occurs, in part, because mixers 1-7 and 1-6 mix the LO signals with leaked carrier LO signals in the signal path. This causes the transmitter output to contain a portion of the unmodulated LO carrier and an image signal.

Figure 2B:
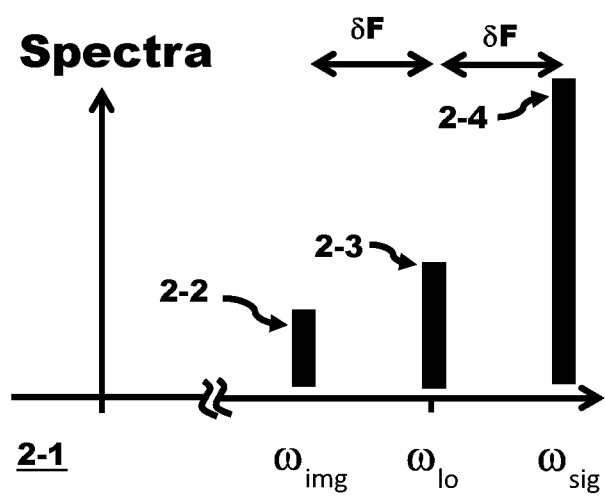
FIG. 2B is a spectral plot of signals generated by the circuit of FIG. 2A in accordance with an aspect of the invention.

The up-converted spectra 2-1 at the output of the adder 1-8 is presented in FIG. 2B. The spectrum of the desired single side band signal is $\omega_{sig}$ 2-4. The spectrum of the undesirable LO leakage signal 2-3 is shown at $\omega_{lo}$. The phase and gain mismatch in the I/Q signals causes the spectrum of the undesired image tone of the signal 2-2 at $\omega_{img}$. The undesired image tone is offset below the LO leakage signal, as the desired single sideband signal is above the LO leakage signal. The tones are separated by δF which is the frequency delta between (($\omega_{lo}$-$\omega_{img}$) and ($\omega_{sig}$-$\omega_{lo}$). In a typical transmitter, these 3 tones ($\omega_{img}$, $\omega_{lo}$, $\omega_{sig}$) are propagated through a series signal path of the Pre-amp 1-9, PA 1-10, Matching Network 1-11, Antenna 1-4 chain and become components of the RF output. It is highly desirable to calibrate the transmitter so that the tones $\omega_{img}$ and $\omega_{lo}$ are minimized or, if possible, eliminated.

The carrier leakage signal $\omega_{lo}$ 2-3 typically occurs in the analog baseband segment of the transmitter. The quadrature signal suffers carrier leakage due to acquired DC offsets in the signal path that combines within the transmitter signal path, causing the signal to contain the unmodulated carrier. The unmodulated carrier is the source of the carrier leakage signal and generates a distortion in the desired signal, since the carrier leakage is transmitted with the desired signal. As the power of the desired signal is reduced due to system requirements, the carrier leakage signal may dominate the overall signal. Therefore, it is desirable to reduce the carrier leakage to improve the quality of the desired signal.

The I/Q mismatch signal in direct conversion systems can degrade the signal quality of the desired signal $\omega_{sig}$ 2-4. The I/Q mismatch occurs within the quadrature paths of the baseband segment of the transmitter. The I/Q components of the quadrature signal each carry a given bandwidth of signal information. Ideally, it is desirable if the characteristics of the circuitry in the baseband segment of the I/Q signal paths exactly match each other over the entire bandwidth of signal information. In this ideal situation, the I/Q mismatch would be reduced to near zero values, since there would be a 90° phase shift and equivalent magnitudes between the corresponding components of the I and Q signals.

However, the actual characteristics of the circuitry in the baseband segment typically do not match each other over the entire bandwidth of the spectra carrying the signal information. Typically, the phase and amplitude of the I/Q signals are matched at the center of the bandwidth of signal information. Since the signal information has a bandwidth centered on the carrier frequency, some of the signal information components are located away from the center carrier frequency. Since the components forming the I/Q paths are not matched at these frequencies away from the carrier frequency, the I/Q signals carried within these frequencies are typically processed with different phase and amplitude characteristics. Thus, the way the I signal is processed at an frequency offset of δω from the carrier frequency by the circuitry may not match the way the Q signal is processed at an frequency offset of δω from the carrier frequency by the circuitry. This is known as I/Q mismatch and occurs between the I/Q paths within the bandwidth of signal information. The result of this I/Q mismatch causes an unwanted sideband image $\omega_{img}$ 2-2 to be generated with the signal spectra, as illustrated in FIG. 2B. The I/Q mismatch introduces distortion into the spectra of the desired signal and causes the constellation of the modulated signal being transmitted to be distorted. Therefore, it is desirable to reduce the I/Q mismatch to improve the quality of the desired signal.

Given that the amplitudes of the offending spectra of carrier leakage and the I/Q mismatch signals need to be reduced; the first step is to detect these offending spectra due to the mismatches. Once the offending spectra is detected, various circuit techniques and algorithms can be used together to reduce the offending spectra and thereby improve the signal quality of the desired signal.

The algorithm in conjunction with various circuit configurations can be implemented in a computer. The algorithm may also contain instructions that, when executed, perform one or more methods, such as those described above. The information carrier is a computer- or machine-readable medium, such as the memory, the storage device, or memory on processor.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

One example of a detection circuit 2-12 is illustrated in FIG. 2A and is used to detect the offending spectra. This version of the detection circuit requires at least three major processing blocks: a mixer 2-5, a feedback VCO 2-6, and a filter 2-7 in order to detect the distortions. These three major processing blocks require dozens of transistors, inductors, capacitors and can occupy a significant portion of area on the integrated circuit substrate (chip). The VCO alone requires a charge pump, a loop filter, a prescalar, a divider, a crystal oscillator and/or a sigma delta modulator. Furthermore, the detection circuit 2-12, as illustrated in FIG. 2A, needs to be designed for stability concerns where the PLL transient behavior, settling time, VCO capacitor bank calibration, etc. within the feedback VCO 2-6 needs to be designed and simulated to operate within tight tolerances.

In addition to the area usage, these processing blocks dissipate power. For a portable system, a battery can provide a given amount of energy between recharges. These processing blocks drain the energy from the battery and require the battery to be charged between uses at shorter time intervals.

The output of the adder 1-8 is applied to the mixer 2-5 in the detection circuit 2-12 and mixed with the signal from a feedback VCO 2-6. The output of the mixer 2-5 is filtered by the filter 2-7 and applied to the input of the ADC 2-8. Once the detected signal is filtered 2-7, the filtered signal is converted into the digital domain by the ADC and processed by an algorithm programmed with the digital signal processor (DSP) 2-9. Once these distortions are detected, the measured values are used to decrease the amount of distortion by using a feedback circuit to minimize each of the distortion components.

For example, a number of calibration techniques can be used such as the least mean square (LMS) algorithm. Several measurement tests are typically performed by the DSP 2-9 to adjust the amplitude, the phase, and the DC offset such that the distortion due to I/Q mismatch and carrier leakage are each minimized. The DSP uses various algorithms based on these calibration techniques to measure and adjust these parameters. The algorithms may be programmed using software programs, computer code, machine code, etc.

As each of these calibrations are performed, an adjustment block 2-10 can adjust the adjustable components (not shown) within the LO 1-5 signal path and in the adjustable components (not shown) within the I/Q signal paths. These adjustments reduce the undesired LO leakage and image rejection distortions. The measurements can be performed iteratively during inactive periods and the results can be stored in memory. Then, the frequency of the feedback VCO 2-6 can be altered to mimic a different carrier frequency and perform the detection, measurements, and adjustments again such that the distortions at this different carrier frequency can be minimized.

Note that the tap point of the measurement occurs after the adder 1-8. Thus, this feedback correction does not compensate for any additional distortion that may occur in the series signal path containing the pre-amp 1-9 and PA 1-10 illustrated in FIG. 1B.

Figure 2C:
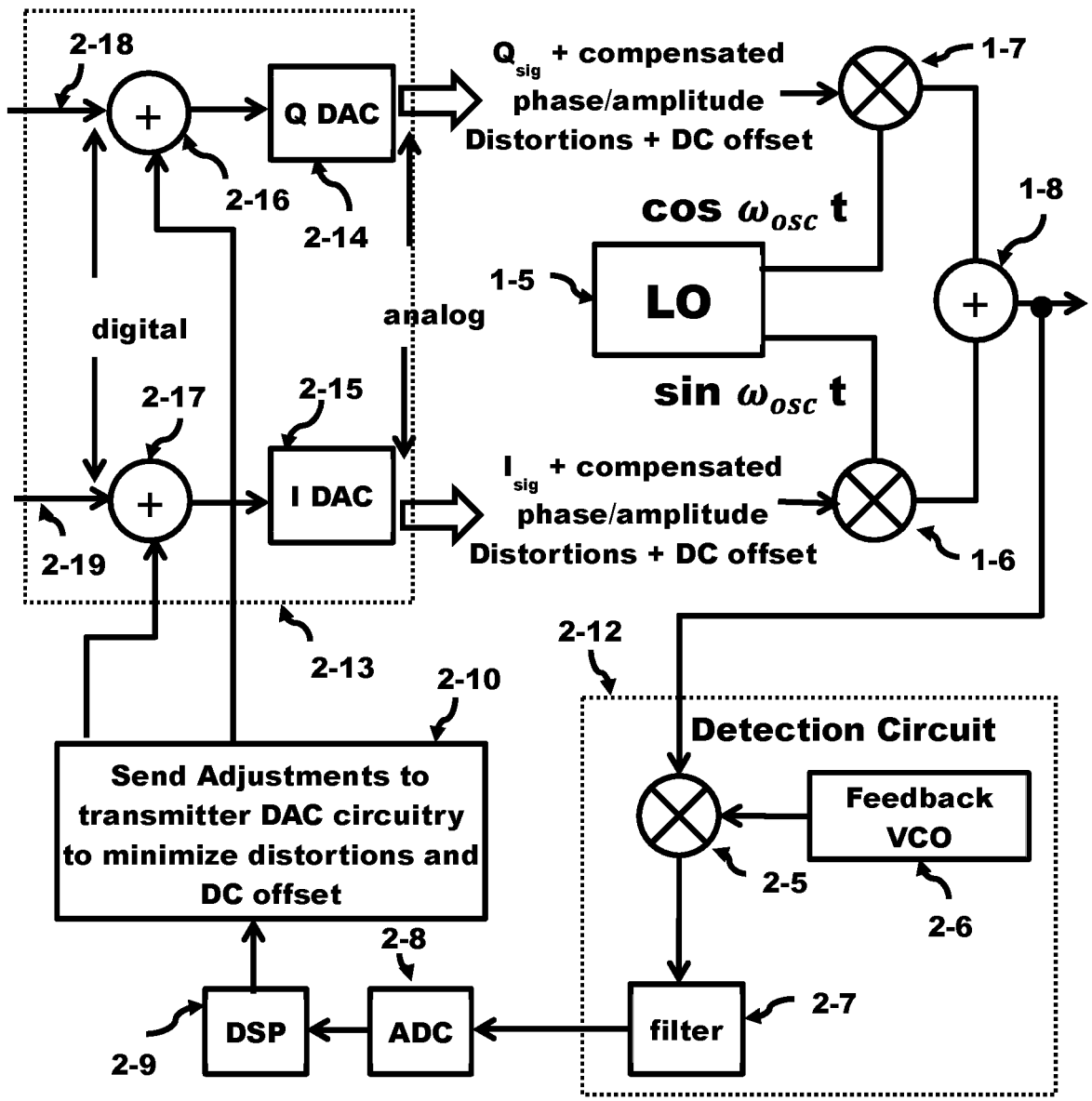
FIG. 2C is a block diagram of a direct conversion up-converter driven by transmitter digital to analog converter (DAC) I/Q signals along with phase/amplitude/DC offset distortions and corrective circuitry in accordance with an aspect of the invention.

FIG. 2C illustrates a correction technique where the correction signal from adjustment block 2-10 is applied to the adders 2-16 and 2-17. In this case, the correction signals are added to the digital stream of the I signal 2-19 and the Q signal 2-18 in the digital domain. The I/Q signal are then applied to the digital-to-analog converters 2-15 and 2-14, respectively. The analog I/Q signals now contain the compensated phase/amplitude and DC offset to offset the undesired phase/amplitude and DC offset signals. The feedback loop containing the up-converter, the detection circuit, ADC, and DSP monitor the detected signal and can iteratively apply correction signals to the adders 2-16 and 2-17 until the distortion has been minimized or eliminated.

Figure 3A:
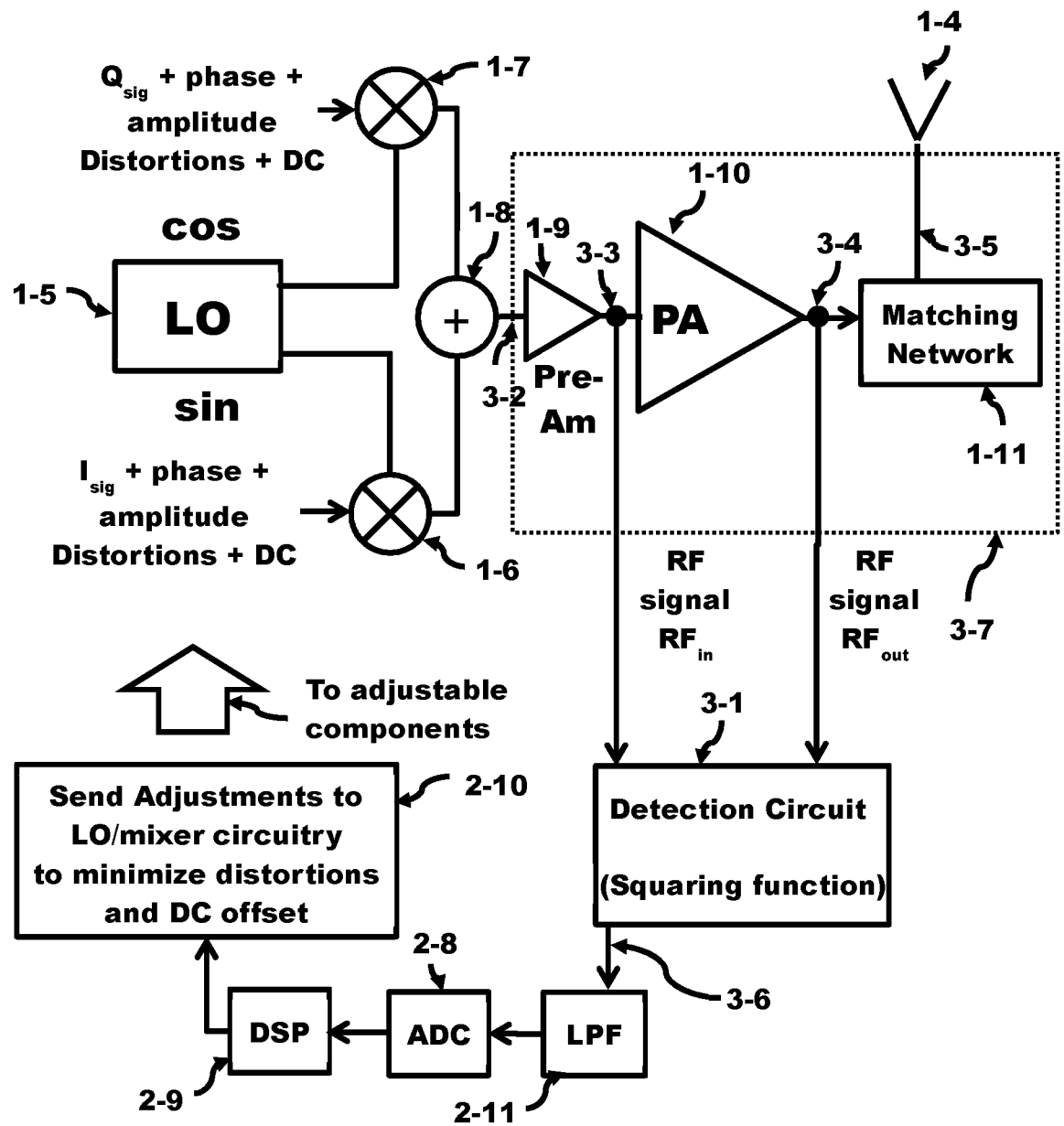
FIG. 3A is a block diagram of a direct conversion transmitter driven by I/Q signals along with compensation adjustments for phase and amplitude distortions and a detection circuitry based around the power amplifier (PA) in accordance with an aspect of the invention.

FIG. 3A illustrates an innovative embodiment of detecting the offending spectra without the use of a feedback VCO 2-6 or mixer 2-5 as illustrated in FIG. 2A. Instead, the detection circuit 3-1 taps two ports from the series signal path of a series network within the dotted block 3-7. One exemplary aspect provides for tapping the ports 3-3 and 3-4, as depicted in FIG. 3A. A series signal path is defined as a signal path that comprises circuit elements coupled in series. Separate ports are assigned between two adjacent circuit elements within said series signal path. The input to the series signal path is labelled as the input port, while the output of the series signal path is labelled as the output port. The circuit elements can comprise: pre-amp, amplifiers, low noise amplifier, certain filters, matching networks, etc. One example is the path illustrated comprising the nodes 3-2, 3-3, 3-4, and 3-5 of such a path; however, communication system circuits can comprise many such series signal paths within an integrated circuit chip. For example, a receive path in a transceiver containing a low noise amplifier, pre-amp and amplifier would be another example of a series signal path.

One particular series signal path comprises the path formed by coupling the pre-amp 1-9, the PA 1-10, and the matching network 1-11 serially coupled, such as depicted inside the dotted block 3-7 in FIG. 3A. The series signal path is tapped at two ports and applied to the detection circuit 3-1. In this case, at the port 3-3 applying the RF signal $RF_{in}$ to the PA and port 3-4 of the PA generating the RF signal $RF_{out}$ at the output of the PA 1-10. In alternative aspects, other tapped ports from the series signal path can be used. The spectra of these RF signals at each of the ports in this series path are similar to that illustrated in FIG. 2B. At least two different ports of the RF spectra from the series path are applied to the detection circuit 3-1.

These two ports of 3-3 and 3-4 of the PA 1-10 circuit element are applied to the detection circuit 3-1, which contains a squaring function capability. Note that the signal at port 3-4 is an amplified version of the signal at port 3-3; thus, the spectra at port 3-3 will also be amplified at the port 3-4. The spectra at port 3-4 are a version of the spectra at port 3-3. The squaring circuit multiplies the two versions of the spectra of the RF signal by itself. The signals from these tapped ports are effectively mixed against each other, thereby eliminating the need for the feedback VCO 2-6 and the mixer 2-5. The components of the spectra at each of the tapped ports are given in EQU. 1 (disregarding the amplification).

$$I_\omega = A_1 \cos(\omega_1 t); L_\omega = A_2 \cos(\omega_2 t); \text{ and } S_\omega = A_3 \cos(\omega_3 t) \quad \text{(EQU. 1)}$$

Figure 3B:
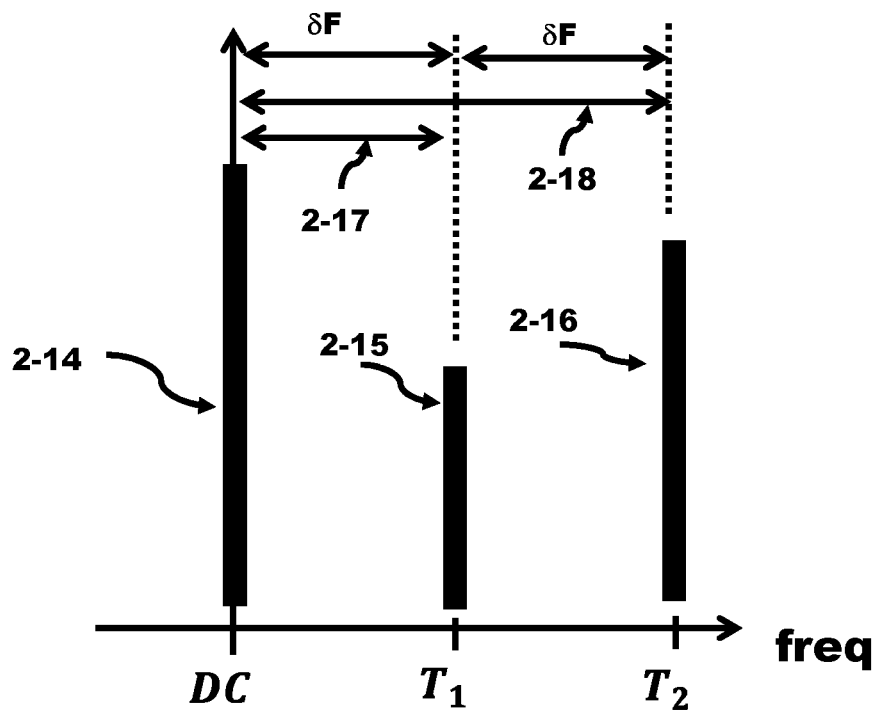
FIG. 3B is a spectral plot of down-converted signals in the circuit of FIG. 3A assuming the input spectra of FIG. 2A in accordance with an aspect of the invention.

The detection circuit 3-1 in FIG. 3A generates the spectra illustrated in FIG. 3B at resultant node 3-6. The output of the squaring transistor is given in EQU. 2:

$$(L_\omega + L_\omega + S_\omega)^*(I_\omega + L_\omega + S_\omega) = [A_1 \cos(\omega_1 t) + A_2 \cos(\omega_2 t) + A_3 \cos(\omega_3 t)]^2 \quad \text{(EQU. 2)}$$

and expanded in EQU. 3:

$$= (A1)(A2)\cos(\omega_1 t - \omega_2 t) + (A1)(A3)\cos(\omega_1 t - \omega_3 t) + (A2)(A3)\cos(\omega_2 t - \omega_3 t) + \ldots \text{ other terms} \quad \text{(EQU. 3)}$$

In EQU. 3, the "other terms" contain the DC term and higher order frequency terms of $((\omega_1 t + (\omega_2 t)), (\omega_2 t + \omega_3 t))$, etc. A low pass filter 2-11 is used to filter out these higher order frequency terms. The filtered squaring function output spectra 3-7 at the output of the LPF 2-11 are depicted in FIG. 3B, where $T_1$ 2-15 is the tone consisting of $[(A1)(A2)\cos(\omega_1 t - \omega_2 t) + (A2)(A3)\cos(\omega_2 t - \omega_3 t)]$ and $T_2$ 2-16 is the tone consisting of $(A1)(A3)\cos(\omega_1 t - \omega_3 t)$. The DC term is presented as DC 2-14.

Note that the tone $T_1$ 2-15 is located at a frequency separated from DC 2-14 by δF 2-17 and the tone $T_2$ 2-16 is located at a frequency separated from DC 2-14 by 2*δF 2-18. This is due to the squaring function within the detection circuit 3-1 which multiplies the spectra illustrated in FIG. 2B by another version of the spectra modified by at least one circuit element. The calibration algorithm then adjusts the DC offset of the transmitter, and the gain/phase of the transmitter I/Q path to reduce these two tones: $T_1$ and $T_2$. When $T_1$ and $T_2$ are reduced to minimum, the undesirable RF output of the LO leakage and image tones are also reduced to a minimum.

Figure 4:
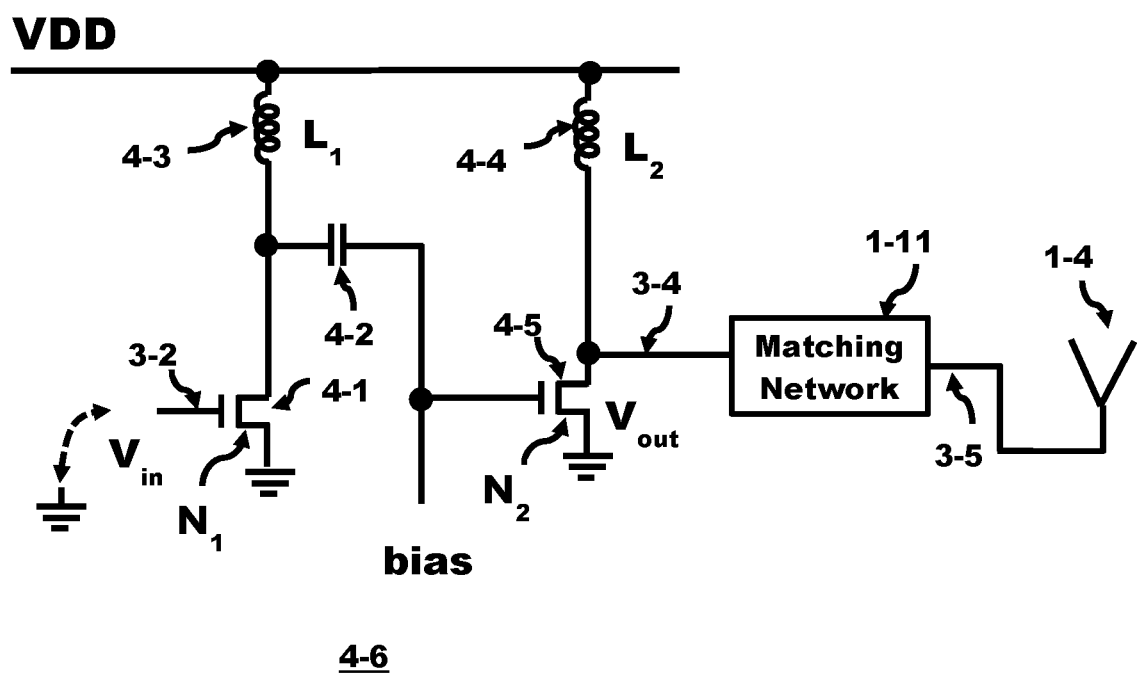
FIG. 4 is a circuit schematic of a power amplifier in accordance with an aspect of the invention.

FIG. 4 illustrates one aspect of the circuit schematic 4-6 of the series signal path 3-7 for the transmitter stage. The pre-amp 1-9 and the PA 1-10 in the dotted box 3-7 of FIG. 3A is illustrated as transistors, capacitors, and inductors. Transistors $N_1$ and $N_2$ are sized to provide a scaled amplification. The transistor nomenclature for the $N_1$ and $N_2$ transistors imply a N-channel MOS (Metal Oxide Semiconductor) transistor. The pre-amp comprises the inductor $L_1$ 4-3 and the transistor $N_1$ 4-1, while PA 1-10 comprises the inductor $L_2$ 4-4 and the transistor $N_2$ 4-5. The Pre-amp is coupled to the PA via the capacitor 4-2. The signal from the adder 1-8 is coupled to the gate of transistor $N_1$ at port 3-2. The pre-amp amplifies the signal and couples the amplified signal to the gate of transistor $N_2$ at port 3-3. The PA signal at port 3-4 is coupled to the matching network 1-11. The matching circuit can be designed to transfer maximum power between the port 3-4 and port 3-5 coupled to the antenna 1-4. The spectra as illustrated in FIG. 2B can be found at the ports 3-2, 3-3, 3-4 and 3-5 in varying amplitude levels (depending on the gain of the pre-amp, PA, and matching network).

Figure 5:
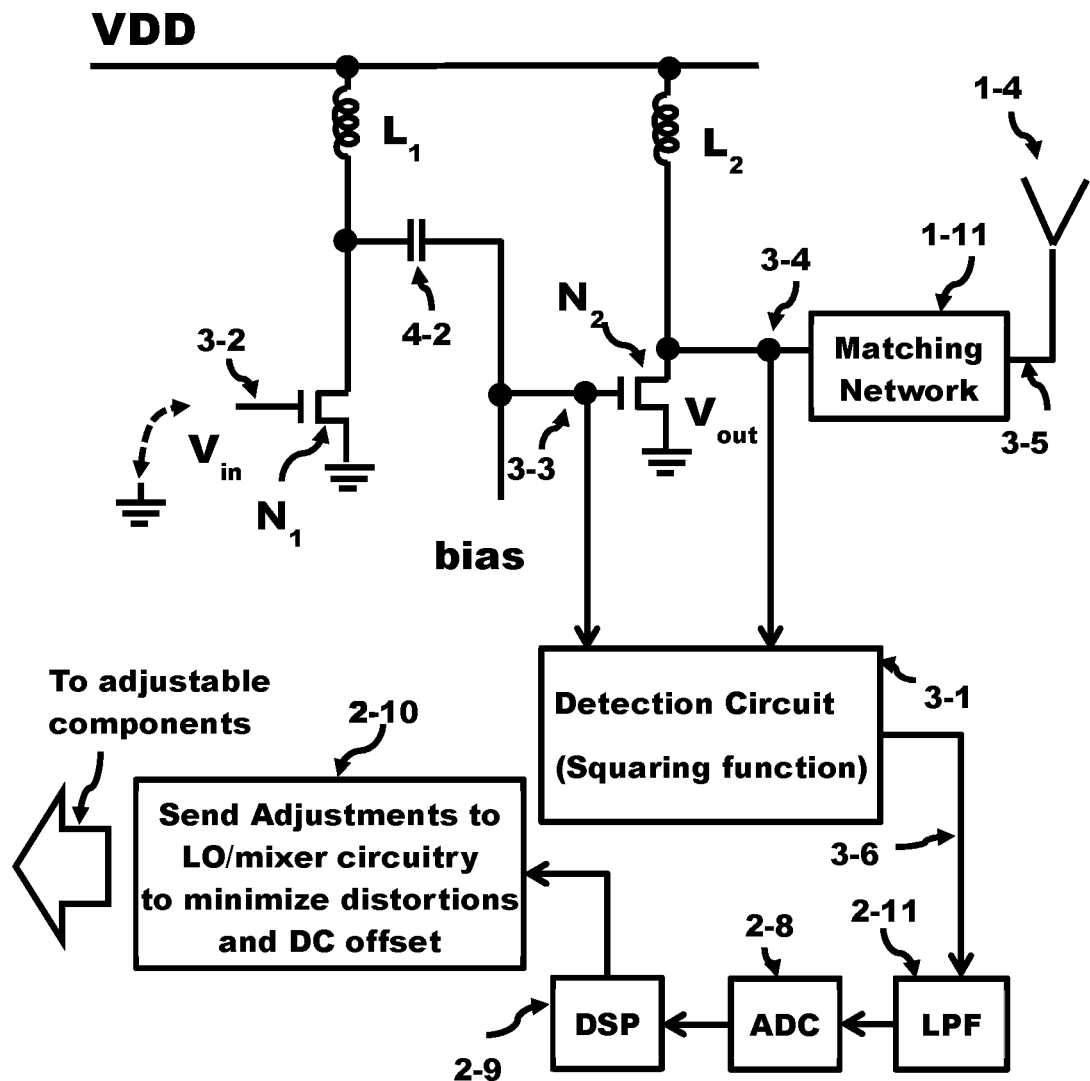
FIG. 5 is a block diagram of a detection circuit connected to a power amplifier to reduce distortions in accordance with an aspect of the invention.

FIG. 5 depicts the ports 3-3 and 3-4 of the series signal path being tapped and coupled to the detection circuit block 3-1 which multiplies the spectra at port 3-3 with the spectra at port 3-4. Since these spectra are similar but vary in amplitude, the multiplier is called a squaring function. The result of the squaring function is coupled to the output of the detection circuit at resultant node 3-6. The spectra of the detected signal at resultant node 3-6 is processed as before by the LPF, ADC, DSP, etc. to adjust the phase, amplitude and DC offset so that $T_1$ and $T_2$ are minimized.

Figure 6A:
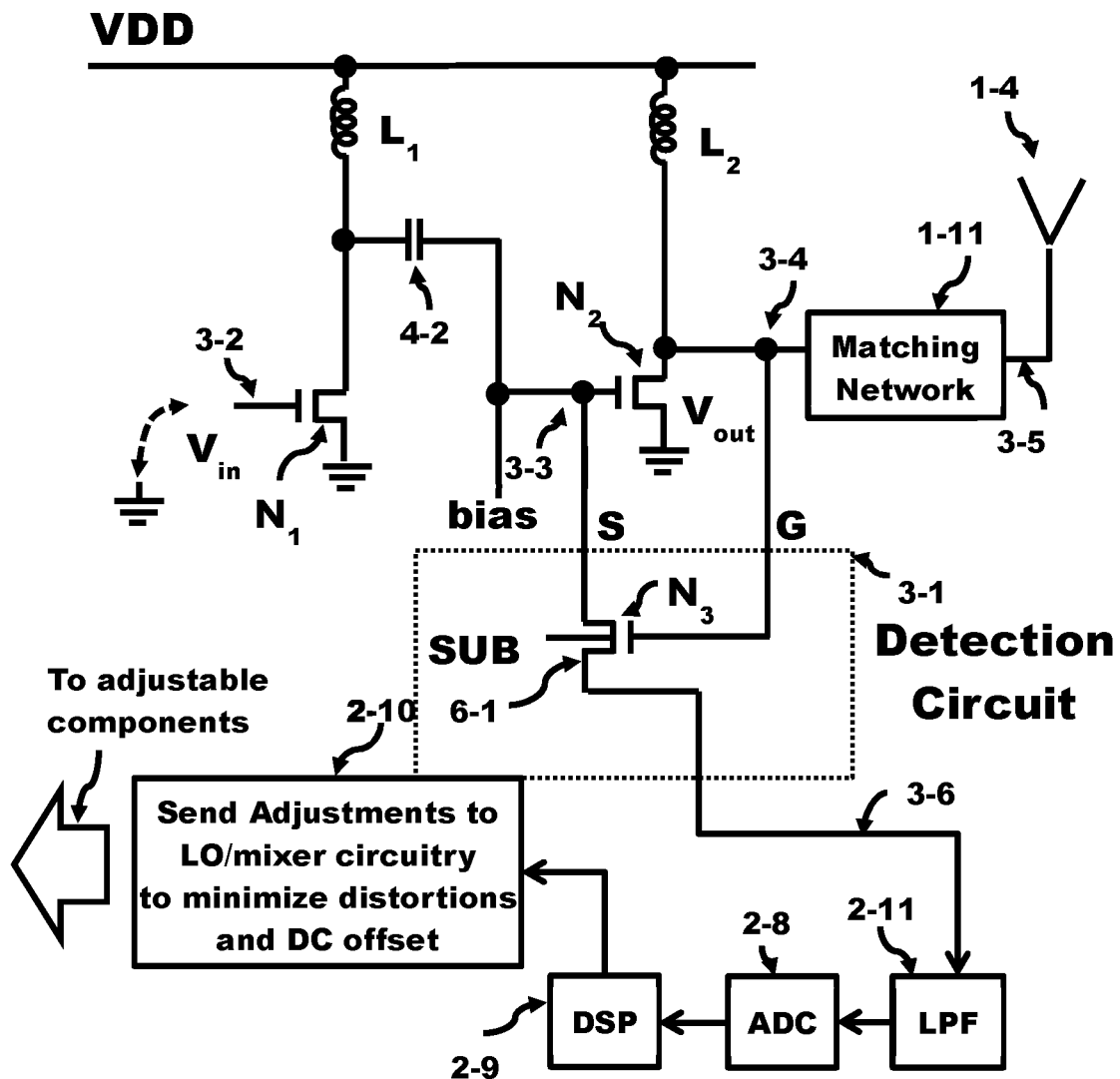
FIG. 6A is a circuit and block diagram depicting a single transistor operating as a detecting element in a detector circuit in accordance with an aspect of the invention.

FIG. 6A presents one aspect of employing a single transistor 6-1 which can be used to perform the squaring function. Transistor $N_3$ can be a very small device, of the order of 1/100 the size of the power amplifier (PA) transistor $N_2$. The source (S) of transistor $N_3$ is coupled to port 3-3 of the series path while the gate (G) of $N_3$ is coupled to port 3-4 of the series path. The substrate (SUB) of transistor $N_3$ can be tied to ground, although other voltage potential levels can be used. Due to the device being small, $N_3$ has negligible impact on normal operation of the PA circuit, since the loading of the transistor $N_3$ on the port 3-3 and 3-4 of transistor $N_2$ are minimal. In addition, the transistor $N_3$ behaves as a square-law device and multiplies the spectra at port 3-3 by the spectra at port 3-4 and generates the output at the drain (D) of transistor $N_3$ which is the resultant node 3-6. Thus, the single transistor $N_3$ performs the function performed by the mixer 2-5 and the feedback VCO 2-6 in the detection circuit 2-12 of FIG. 2A. The spectra of the detected signal at drain node (D) of transistor $N_3$ is processed as before by the LPF, ADC, DSP, etc. to adjust the phase, amplitude and DC offset so that $T_1$ and $T_2$ are minimized.

Furthermore, since drain of $N_3$ is connected to gates of transistors in the LPF 2-11, there is no dc bias current through the $N_3$ device. $N_3$ operates like a passive mixer, where both the gate and source nodes of the transistor are connected to the RF output signal ports in the series signal path carrying the spectra of the RF signals: $I_\omega = A_1 \cos(\omega_1 t)$, $L_\omega = A_2 \cos(\omega_2 t)$, and $S_\omega = A_3 \cos(\omega_3 t)$. As a passive mixer, it multiplies the RF spectra times a version of itself producing the down-converted signal illustrated in FIG. 3B and described by the earlier equation EQU. 3.

This detection circuit 3-1 can save over two orders of magnitude in chip area real estate and power dissipation when compared to the complex circuit components and design of the mixer 2-5 and feedback VCO 2-6 shown in the detection circuit 2-12 of FIG. 2C. In addition, the issues of stability and other design concerns for the VCO and associated circuitry in the detection circuit 2-12 are eliminated, simplifying the overall design of the detection circuit which utilizes a single transistor.

Figure 6B:
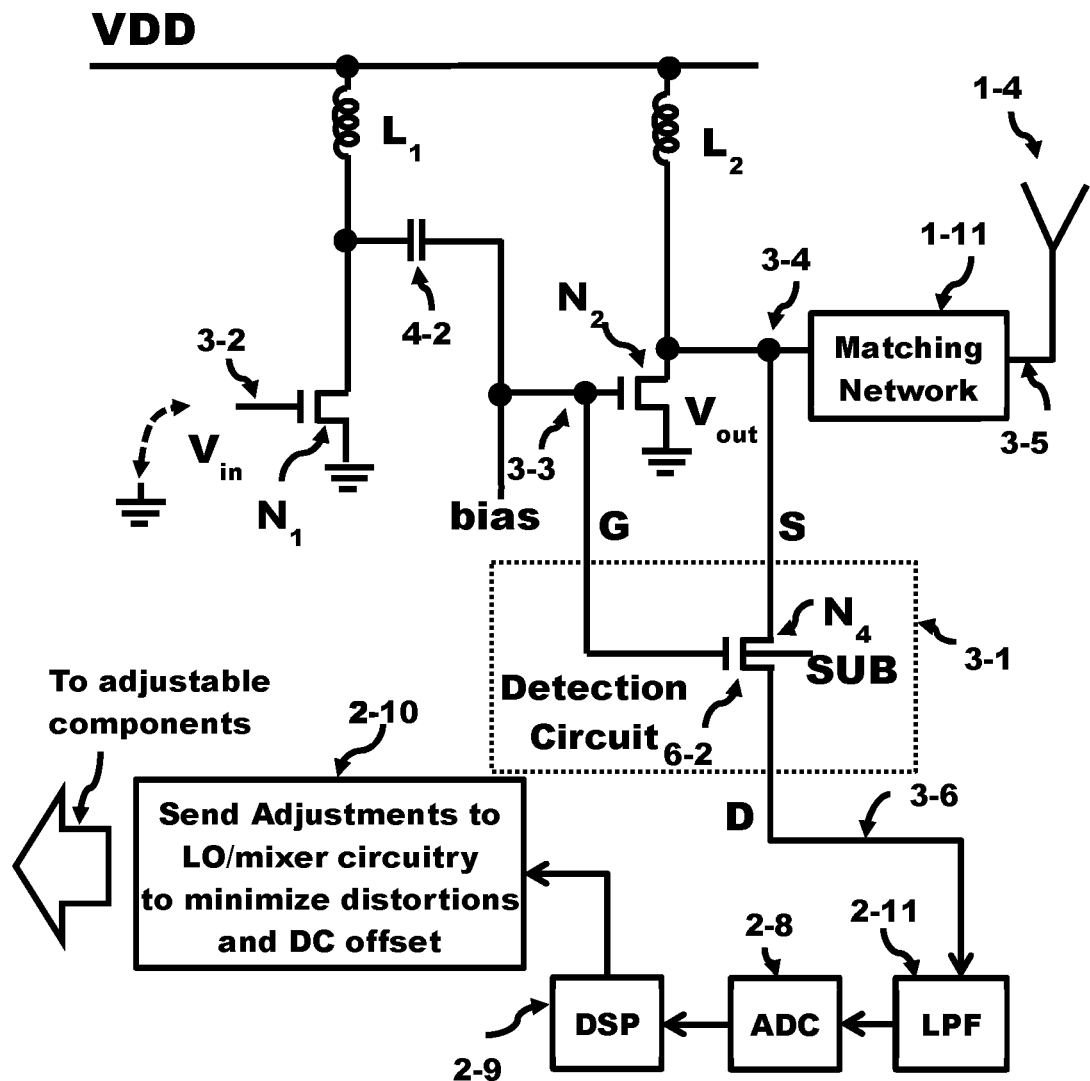
FIG. 6B illustrates alternative configuration of a system comprising a single transistor operating as a detecting element in a detector in accordance with an aspect of the invention.

FIG. 6B presents another aspect of using a single transistor 6-2 to perform the squaring function. Transistor $N_4$ can be sized the same as the transistor 6-1 in FIG. 6A. However, the source (S) of transistor $N_4$ is coupled to port 3-4 of the series path while the gate (G) of $N_4$ is coupled to port 3-3 of the series path. The substrate (SUB) of transistor $N_4$ can be tied to ground, although other voltage potential levels can be used. Similarly, $N_4$ has negligible impact on normal operation of the PA circuit, since the loading of the transistor $N_4$ on the ports 3-3 and 3-4 of transistor $N_2$ are minimal. In addition, the transistor $N_4$ behaves as a square-law device and multiplies the spectra at port 3-3 by the spectra at port 3-4 and generates the output at the drain (D) of transistor $N_4$ at resultant node 3-6. Thus, the single transistor $N_4$ performs the function performed by the mixer 2-5 and the feedback VCO 2-6 in the detection circuit 2-12 of FIG. 2A. The spectra of the detected signal at drain node (D) of transistor $N_4$ is processed as before by the LPF, ADC, DSP, etc. to adjust the phase, amplitude and DC offset so that $T_1$ and $T_2$ are minimized.

Figure 7:
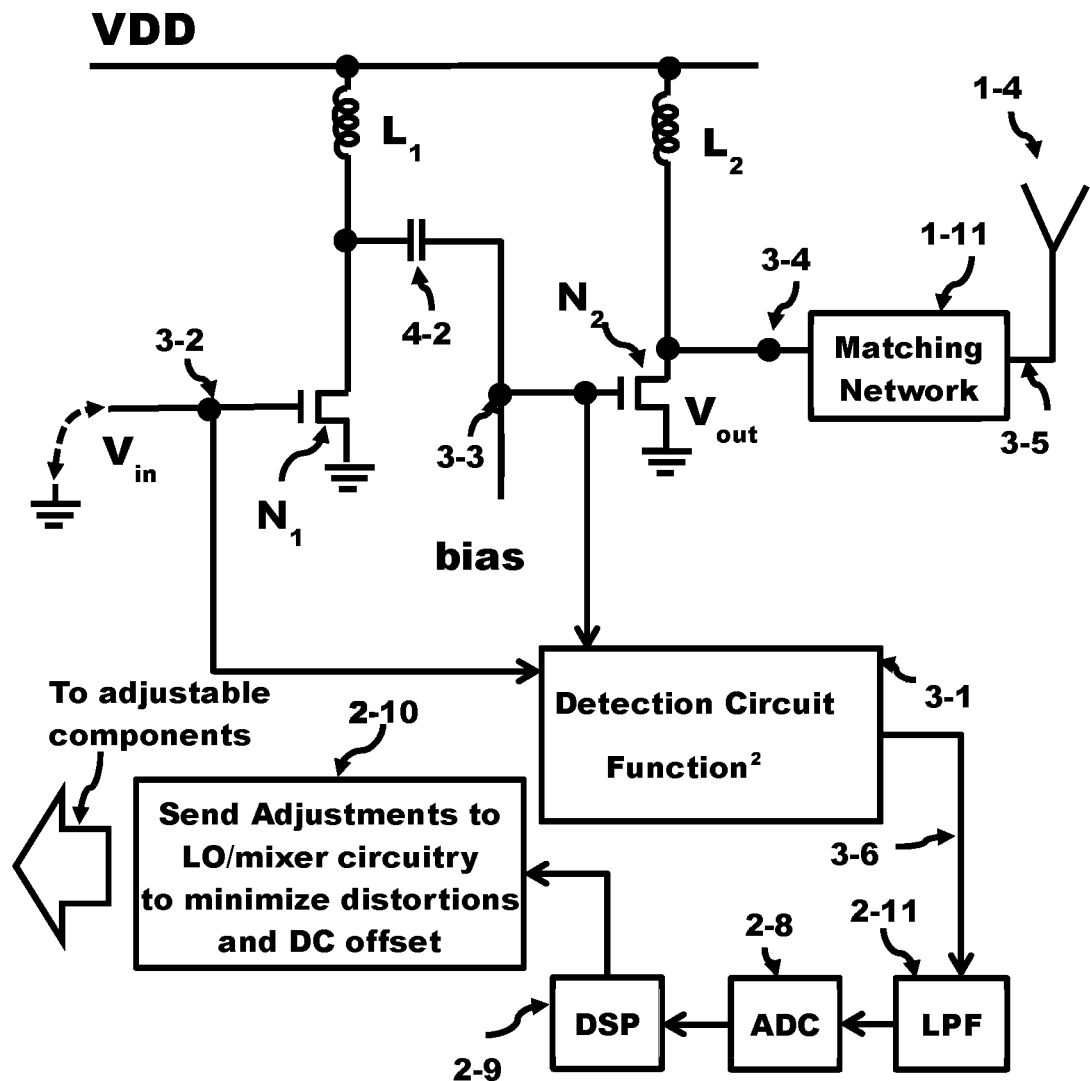
FIG. 7 is a circuit and block diagram depicting alternative set of tap points coupling a transmitter path to a detecting circuit in accordance with an aspect the invention.

FIG. 7 depicts a circuit similar to that of FIG. 5, except the series signal path is tapped at ports 3-2 and 3-3 and applied to the detection circuit 3-1. Other possible tapped port pairs in the series signal path can include: 3-2, 3-4; 3-3, 3-5; etc. Since the tapped ports are applied to gate and drain of the transistor in the detection circuit 3-1, a voltage different between the tapped points generates a ($V_g$-$V_s$) voltage which can be used to generate an $I_{ds}$ current. The detection circuit can utilized the transistor configuration as illustrated in either FIG. 6A or FIG. 6B. The spectra of the detected signal at drain node (D) of transistor within the detection circuit 3-1 is processed as before by the LPF, ADC, DSP, etc. to adjust the phase, amplitude and DC offset so that $T_1$ and $T_2$ are minimized.

Accordingly, the transistors $N_3$ or $N_4$ in the detection circuit 3-1 can eliminate the need to be concerned with the details of the VCO, the charge pump, loop filter, pre-scalar, divider, crystal oscillator and/or sigma delta modulator design or specifications of these components. Nor is there a need to describe the PLL transient behavior, settling time, VCO capacitor bank calibration, etc.

Figure 8A:
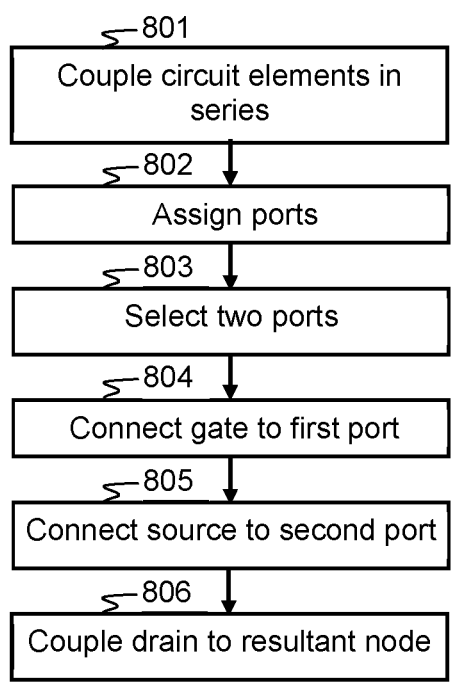
FIG. 8A is a flow diagram that depicts a method for generating a mixed signal between two selected ports in accordance with an aspect of the invention.

FIG. 8A is a flow diagram that depicts a method for generating a mixed signal between two selected ports in accordance with an aspect of the invention. Multiple circuit elements are coupled in series 801 to form a series signal path. Separate ports are assigned between two adjacent circuit elements within the series signal path 802 such that an input port couples to an input of a first circuit element in the series signal path and an output port couples to an output of a last circuit element in the series signal path. Any two of the ports is selected 803, and a gate of a transistor is connected to a first selected port 804, and a source of the transistor is connected to a second selected port 805. A drain of the transistor is coupled to a resultant node 806 so that the transistor mixes a signal at the first selected port with a signal at the second selected port, thereby generating at the resultant node the mixed signal between the two selected ports.

In one aspect, the signal at the first selected port has a first spectra comprising at least one of a homodyne signal, a LO leakage signal, and an image rejection signal applied to the input node. The signal at the second selected port has a second spectra comprising at least one of a version of the homodyne signal, a version of the LO leakage signal, and a version of the image rejection signal modified by at least one of the plurality of circuit elements. The version components of the second spectra can comprise at least a non-inverted or an inverted component of the first spectra, an amplified or an attenuated version of the first spectra, or a phase shifted component of the first spectra.

In some aspects, the method depicted in FIG. 8A further comprises coupling a low pass filter to the resultant node. In one aspect, a digital signal processor is coupled to an output of the low pass filter and configured to calculate correction factors to reduce the LO leakage signals and the image rejection signals of signals within the series signal path.

The method depicted in FIG. 8A can further comprise coupling an up-converted RF signal to the input port. In another aspect, the first selected port corresponds to an input node or an output node of an amplifier, and the second selected port corresponds to the other node (e.g., output node or input node) of the amplifier.

Figure 8B:
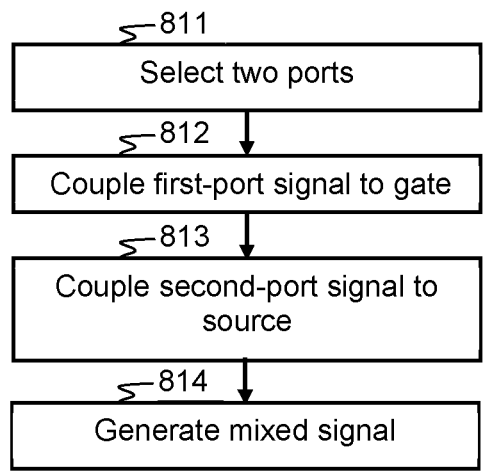
FIG. 8B is a flow diagram that depicts a signal processing method in accordance with an aspect of the invention.

FIG. 8B is a flow diagram that depicts a signal processing method in accordance with an aspect of the invention. A first step 811 provides for selecting two ports in a series signal path such that a signal at a first selected port has a first spectra comprising at least one of a homodyne signal, a LO leakage signal, and an image rejection signal. A signal at a second selected port has a second spectra comprising at least one of a version of the homodyne signal, a version of the LO leakage signal, and a version of the image rejection signal modified by at least one circuit element in the series signal path.

In some aspects, the first selected port comprises an input port coupled to an input of a first circuit element in the series signal path, and the second selected port comprises an output port coupled to an output of a last circuit element in said series signal path. The "first" and "last" selected ports correspond to the direction of signal flow in the series signal path.

Version components (i.e., the version of the homodyne signal, the version of the LO leakage signal, and/or the version of the image rejection signal modified by at least one circuit element in the series signal path) of the second spectra can comprise at least a non-inverted or an inverted, an amplified or an attenuated, or a phase shifted component of the first spectra.

The method further comprises coupling a signal from the first selected port to a gate of a transistor function 812 and coupling a signal from the second selected port to a source of the transistor function 813. It should be appreciated that in some aspects, the transistor function can be performed by a transistor. In some aspects, the transistor function can be performed by a circuit or machine programmed to function as a transistor. The transistor function is operated to mix the signal from the first selected port with the signal from the second selected port to generate a mixed signal 814 at a drain of the transistor function.

In one aspect of the invention, the method depicted in FIG. 8B further comprises coupling an up-converted RF signal to the first selected port. In some aspects, the first selected port is coupled to an input node of an amplifier, and the second selected port is coupled to an output node of the amplifier. In some aspects, the method can further comprise providing a low pass filter function to the drain. The low pass filter function can further comprise a digital signal processor function configured to calculate correction factors to reduce the LO leakage signals and the image rejection signals in the series signal path.

Finally, it is understood that the above descriptions are only illustrative of some aspects of the invention. Various alterations, improvements, and modifications can occur and are anticipated in the disclosure. Various aspects may, however, be embodied in many different forms and should not be construed as limited to those disclosed herein. For example, the various aspects disclosed herein can be used for any of the various wired or wireless standards incorporating a series signal path within a transceiver. These techniques can be employed on the receive and/or transmit paths to extract information from a series signal path.

It is understood that the various aspects of the invention, although different, are not mutually exclusive. In accordance with these principles, those skilled in the art may devise numerous modifications without departing from the spirit and scope of the invention. Although N-MOS transistors are depicted in the circuit schematics, P-MOS transistors can be easily be designed to perform similar capabilities. In addition, a network and a portable system can exchange information wirelessly by using communication techniques such as Time Division Multiple Access (TDMA), Frequency Division Multiple Access (FDMA), Code Division Multiple Access (CDMA), Orthogonal Frequency Division Multiplexing (OFDM), Ultra Wide Band (UWB), Wi-Fi, WiGig, Bluetooth, etc. The network can comprise the phone network, IP (Internet protocol) network, Local Area Network (LAN), ad-hoc networks, local routers, and even other portable systems.

What is claimed is:
1. An apparatus configured to mix a first signal with a second signal, comprising:
a series signal path;
a first node and a second node coupled within said series signal path;
a gate of a transistor connected to said first node;
a source of said transistor connected to said second node; and
a drain of said transistor coupled to a resultant node, wherein said transistor mixes said first signal at said first node with said second signal at said second node to generate a mixed signal between said first signal and said second signal at said resultant node.

2. The apparatus of claim 1, wherein the first node and the second node are separate nodes.

3. The apparatus of claim 1, wherein the first node is an input node of a circuit element in the series signal path, and the second node is an output node of the circuit element.

4. The apparatus of claim 1, wherein the first node is an output node of a circuit element in the series signal path, and the second node is an input node of the circuit element.

5. The apparatus of claim 1, further comprising:
a circuit element in said series signal path;
a first spectra comprising a first homodyne signal, a first local oscillator (LO) leakage signal, and a first image rejection signal applied to said first node; and
a version of said first spectra comprising a second homodyne signal, a second LO leakage signal, and a second image rejection signal modified by a circuit element at said second node.

6. The apparatus of claim 5, further comprising:
an input port coupled to an input of said series signal path; and
an output port coupled to an output of said series signal path, wherein an up-converted RF signal is coupled to said input port.

7. The apparatus of claim 5, further comprising:
a low pass filter (LPF) coupled to said resultant node; and
a digital signal processor (DSP) coupled to said LPF, wherein said DSP calculates correction factors to reduce said LO leakage signals and said image rejection signals in all said spectra.

8. The apparatus of claim 6, further comprising:
an antecedent circuit element coupled to a circuit element at said input port; and
a subsequent circuit element coupled to said circuit element at said output port, wherein an up-converted RF signal is coupled to said antecedent circuit element.

9. The apparatus of claim 1, further comprising a circuit element in said series signal path, the circuit element comprising an amplifier stage that either non-inverts or inverts said second signal with regard to said first signal.

10. The apparatus of claim 1, further comprising a circuit element in said series signal path, the circuit element comprising an amplifier stage that amplifies and phase shifts said second signal with regard to said first signal.

11. An apparatus configured to generate a self-mixed signal, comprising:
a first circuit element including an first node and an second node;
a gate of a transistor coupled to said first node;
a source of said transistor coupled to said second node;
a drain of said transistor coupled to a resultant node;
a first spectra comprising a first homodyne signal, a first local oscillator (LO) leakage signal, and a first image rejection signal applied to said first node; and
a version of said first spectra comprising a second homodyne signal, a second LO leakage signal, and a second image rejection signal modified by said circuit element and generated at said second node, wherein said transistor mixes said first spectra with said version of said first spectra generating said self-mixed signal at said resultant node.

12. The apparatus of claim 11, further comprising:
an antecedent circuit element with an input port coupled to first circuit element at said first node; and
a subsequent circuit element coupled with an output port coupled to said first circuit element at said second node, wherein an up-converted RF signal is coupled to said input port.

13. The apparatus of claim 12, further comprising an antenna coupled to said output port.

14. The apparatus of claim 11, further comprising a low pass filter coupled to said resultant node.

15. The apparatus of claim 11, wherein said first circuit element is an amplifier stage that either non-inverts or inverts said input signal at said second node.

16. The apparatus of claim 11, wherein said first circuit element is an amplifier stage that amplifies and phase shifts said input signal at said second node.

17. A method to generate a mixed signal between two selected ports, comprising:
assigning separate ports between two adjacent circuit elements within a series signal path, wherein an input port couples to an input of a first circuit element in said series signal path and an output port couples to an output of a last circuit element in said series signal path;
selecting any two of said ports;
connecting a gate of a transistor to a first selected port of said two of said ports;
connecting a source of said transistor to a second selected port of said two of said ports; and
coupling a drain of said transistor to a resultant node, wherein said transistor mixes a signal at said first selected port with a signal at said second selected port, thereby generating at said resultant node said mixed signal between said two selected ports.

18. The method of claim 17, wherein said signal at said first selected port has a first spectra comprising at least one of a homodyne signal, a local oscillator (LO) leakage signal, and an image rejection signal; and said signal at said second selected port has a second spectra comprising at least one of a version of said homodyne signal, a version of said LO leakage signal, and a version of said image rejection signal modified by at least one of a plurality of circuit elements.

19. The method of claim 18, wherein version components of said second spectra comprises at least a non-inverted or an inverted, an amplified or an attenuated, or a phase shifted component of said first spectra.

20. The method of claim 18, further comprising coupling a low pass filter to said resultant node.

21. The method of claim 20, further comprising coupling a digital signal processor (DSP) to an output of said low pass filter to calculate correction factors to reduce said LO leakage signals and said image rejection signals of all signals within said series signal path.

22. The method of claim 18, further comprising coupling an up-converted RF signal to said input port.

23. The method of claim 18, wherein said first selected port corresponds to an input node or an output node of an amplifier, and said second selected port corresponds to a remaining node of said amplifier.

24. A method, comprising:
selecting two ports such that a signal at a first selected port has a first spectra comprising at least one of a homodyne signal, a local oscillator (LO) leakage signal, and an image rejection signal, and a signal at a second selected port has a second spectra comprising at least one of a version of the homodyne signal, a version of the LO leakage signal, and a version of the image rejection signal modified by at least one circuit element in the series signal path;
coupling a signal from the first selected port to a gate;
coupling a signal from the second selected port to a source; and
mixing the signal from the first selected port with the signal from the second selected port to generate a mixed signal at a drain.

25. The method of claim 24, further comprising coupling an up-converted RF signal to the first selected port.

26. The method of claim 24, wherein the first selected port is coupled to an input node of an amplifier, and the second selected port is coupled to an output node of the amplifier.

27. The method of claim 24, wherein the first selected port is coupled to an output node of an amplifier, and the second selected port is coupled to an input node of the amplifier.

28. The method of claim 24, further comprising coupling a low pass filter to the drain.

29. The method of claim 28, further comprising coupling a digital signal processor to an output of the low pass filter configured to calculate correction factors to reduce the LO leakage signals and the image rejection signals in a series signal path.

* * * * *